US011222839B1

(12) United States Patent
Yang

(10) Patent No.: US 11,222,839 B1
(45) Date of Patent: Jan. 11, 2022

(54) SEMICONDUCTOR STRUCTURE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/037,590

(22) Filed: Sep. 29, 2020

(51) Int. Cl.
    *H01L 23/31*     (2006.01)
    *H01L 23/498*     (2006.01)
    *H01L 23/00*     (2006.01)

(52) U.S. Cl.
CPC .... *H01L 23/49838* (2013.01); *H01L 23/3128* (2013.01); *H01L 24/48* (2013.01); *H01L 2224/48227* (2013.01); *H01L 2924/30105* (2013.01)

(58) Field of Classification Search
CPC ............... H01L 23/49838; H01L 24/48; H01L 23/3128; H01L 2224/48227; H01L 2924/30105

USPC ........................................................ 257/668
See application file for complete search history.

(56) References Cited

U.S. PATENT DOCUMENTS

2020/0075519 A1* 3/2020 Lin ...................... H01L 23/3171

\* cited by examiner

*Primary Examiner* — Elias Ullah
(74) *Attorney, Agent, or Firm* — CKC & Partners Co., LLC

(57) ABSTRACT

A semiconductor structure includes a substrate, a chip, a first edge pad, a first central pad, a second edge pad, and a second central pad. The substrate has a first surface and a conductive trace extending above the substrate. The chip is above the first surface of the substrate, and has a sidewall, a central area, and an edge area. The first edge pad is on the edge area. The first central pad is on the central area and electrically connected to the first edge pad. The second edge pad is on the edge area of the chip. A distance between the first edge pad and the sidewall of the chip is substantially smaller than a distance between the second edge pad and the sidewall of the chip. The second central pad is on the central area of the chip and electrically connected to the second edge pad.

20 Claims, 6 Drawing Sheets

SEMICONDUCTOR STRUCTURE

BACKGROUND

Technical Field

The present disclosure relates to a semiconductor structure.

Description of Related Art

Semiconductor devices are essential for lots of modern electronic applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functions are integrated and packaged into a single module. Furthermore, numerous manufacturing operations are implemented for integration of various types of semiconductor devices.

However, the manufacturing and integration of semiconductor devices involve many complicated steps and operations. Integration of semiconductor devices in low-profile and high-density configurations becomes increasingly complicated. An increase in complexity of manufacturing and integration of the semiconductor devices may cause deficiencies such as poor electrical interconnection and interference.

SUMMARY

One aspect of the present disclosure is a semiconductor structure.

According to some embodiments of the present disclosure, a semiconductor structure includes a substrate, a chip, a first edge pad, a first central pad, a second edge pad, and a second central pad. The substrate has a first surface and a conductive trace extending above the substrate. The chip is disposed above the first surface of the substrate, in which the chips has a sidewall, a central area, and an edge area between the central area and the sidewall. The first edge pad is disposed on the edge area of the chip. The first central pad is disposed on the central area of the chip and electrically connected to the first edge pad. The second edge pad is disposed on the edge area of the chip, in which a distance between the first edge pad and the sidewall of the chip is substantially smaller than a distance between the second edge pad and the sidewall of the chip. The second central pad is disposed on the central area of the chip and electrically connected to the second edge pad.

In some embodiments, the first edge pad and the first central pad are aligned in a first direction, and the second edge pad and the second central pad are aligned substantially in the first direction.

In some embodiments, the first central pad and the second central pad are aligned in a second direction substantially perpendicular to the first direction.

In some embodiments, the first edge pad and the first central pad are connected through a power line, and the second edge pad and the second central pad are connected through a signal line.

In some embodiments, a length of the power line is substantially greater than a length of the signal line.

In some embodiments, a width of the power line is substantially greater than a width of the signal line.

In some embodiments, the semiconductor structure further includes a first bonding wire and a second bonding wire. The first bonding wire is electrically connected between the substrate and the first edge pad. The second bonding wire is electrically connected between the substrate and the second edge pad.

In some embodiments, a vertical projection length of the first bonding wire on the chip is substantially smaller than a vertical projection length of the second bonding wire on the chip.

In some embodiments, the first bonding wire is spaced apart from the first central pad, and the second bonding wire is spaced apart from the second central pad.

In some embodiments, a ratio of a length of the second bonding wire and a length of the signal line is in a range of 0.5 to 2.

In some embodiments, the semiconductor structure further includes a molding compound above the first surface of the substrate and covering the chip.

In some embodiments, the semiconductor structure further includes a conductive bump on a second surface of the substrate opposite to the first surface.

Another aspect of the present disclosure is a semiconductor structure.

According to some embodiments of the present disclosure, a semiconductor structure includes a substrate, a chip, an edge pad, a central pad, a signal line, and a bonding wire. The substrate has a first surface and a conductive trace extending above the substrate. The chip is disposed above the first surface of the substrate. The edge pad is disposed on the chip. The central pad is disposed on a central area of the chip. The signal line is disposed above the chip, and the signal line interconnects the edge pad and the central pad. The bonding wire is electrically connected between the substrate and the edge pad, in which a ratio of a length of the bonding wire and a length of the signal line is in a range of 0.5 to 2.

In some embodiments, the length of the bonding wire is substantially equal to the length of the signal line.

In some embodiments, the bonding wire extends from the conductive trace to the edge pad.

In some embodiments, the semiconductor structure further includes a power line above the chip. The power line is substantially coplanar with the signal line.

In some embodiments, a length of the power line is substantially greater than the length of the signal line.

In some embodiments, the semiconductor structure further includes a molding compound above the first surface of the substrate and covering the chip.

In some embodiments, the molding compound is in contact with the edge pad, the central pad, and the signal line.

In some embodiments, the semiconductor structure further includes a conductive bump on a second surface of the substrate opposite to the first surface.

In the aforementioned embodiments, since the distance between the first edge pad and the sidewall of the chip is substantially smaller than the distance between the second edge pad and the sidewall of the chip, the capacitance can be reduced. As a result, the output signal of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
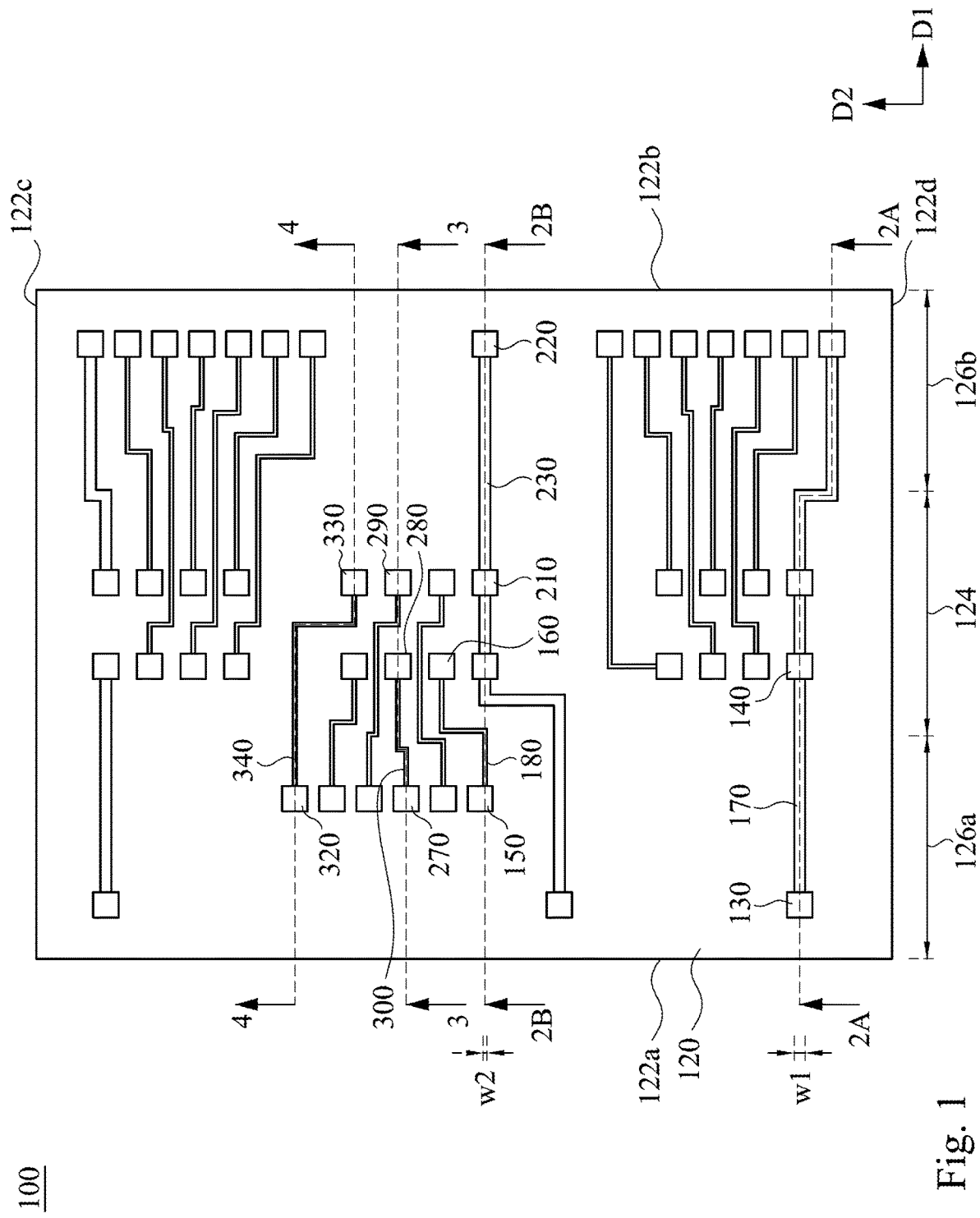
FIG. 1 is a top view of a layout of a semiconductor structure accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Figure 2A:
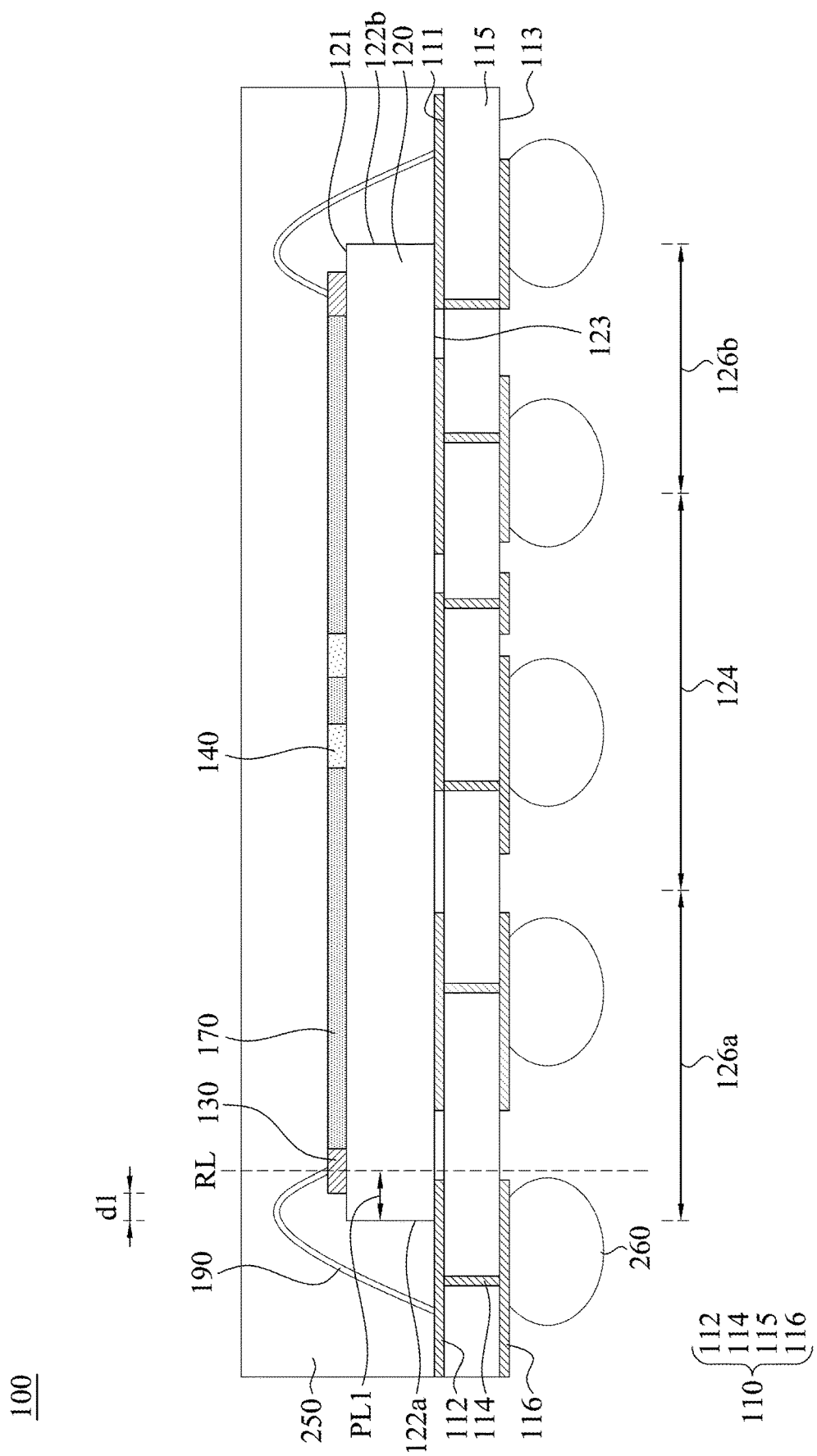
FIG. 2A is a cross-sectional view taken along line 2A-2A of FIG. 1.
Figure 2B:
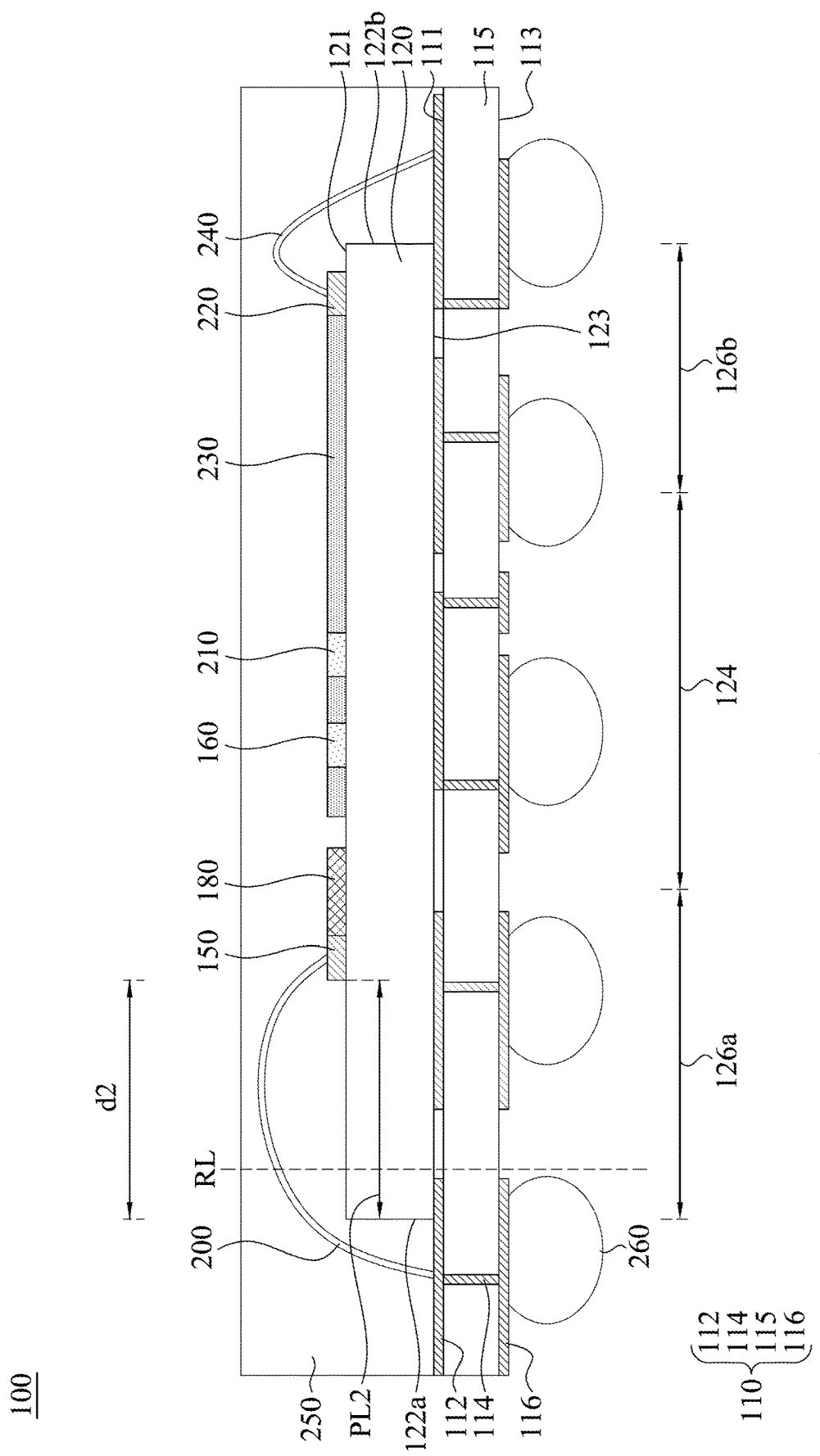
FIG. 2B is a cross-sectional view taken along line 2B-2B of FIG. 1.

FIG. 1 is a top view of a layout of a semiconductor structure 100 accordance with some embodiments of the present disclosure, FIG. 2A is a cross-sectional view taken along line 2A-2A of FIG. 1, and FIG. 2B is a cross-sectional view taken along line 2B-2B of FIG. 1. For clarity, a substrate 110 and bonding wires (e.g., a first bonding wire 190, a second bonding wire 200, a bonding wire 310, and a bonding wire 350) are illustrated in the cross-sectional views and are omitted in the top view. In some embodiments, the semiconductor structure 100 is a semiconductor package or a part of the semiconductor package. Referring to FIG. 1, FIG. 2A, FIG. 2B, the semiconductor structure 100 includes a substrate 110, a chip 120, a first edge pad 130, and a first central pad 140, a second edge pad 150, and a second central pad 160.

The substrate 110 includes a core layer 115 and has a first surface 111 and a second surface 113 opposite to the first surface 111. In some embodiments, the core layer 115 has a quadrilateral, rectangular, square, polygonal or any other suitable shape. In some embodiments, the core layer 115 is a semiconductor substrate. The core layer 115 may include an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the core layer 115 includes a material such as ceramic, glass or the like.

In some embodiments, the core layer 115 is fabricated with a predetermined functional circuit thereon. The substrate 110 may further include a conductive trace 112 extending above the first surface 111 of the substrate 110. The conductive trace 112 may be made of copper, tungsten, aluminum, palladium, alloys thereof, or other suitable materials.

The chip 120 may be disposed above the first surface 111 of the substrate 110. In some embodiments, the chip 120 includes a variety of electrical circuits suitable for a particular application. The chip 120 may include semiconductor devices such as memories, microprocessors, application-specific integrated circuits (ASICs) or the like. In some embodiments, the chip 120 is a dynamic random access memory (DRAM) chip.

In some embodiments, the chip 120 has a front side 121, a back side 123 opposite to the front side 121, opposite first sidewalls 122a and 122b, and opposite second sidewalls 122c and 122d. The first sidewalls 122a, 122b, the second sidewalls 122c, 122d connects the front side 121 and the back side 123 such that the first sidewalls 122a, 122b, the second sidewalls 122c, 122d, the front side 121, and the back side 123 form an exterior boundary of the chip 120. The chip 120 further has a central area 124 and edge areas 126a and 126b. The edge area 126a is between the central area 124 and the first sidewall 122a, and the edge area 126b is between the central area 124 and the first sidewall 122b. The back side 123 of the chip 120 is electrically connected to the conductive trace 112 of the substrate 110. In some embodiments, the chip 120 is bonded above the substrate 110 by an adhesive material such as a glue or the like. For example, the adhesive material is in contact with the back side 123 of the chip 120 and the conductive trace 112 of the substrate 110.

A redistribution layer (RDL) is disposed on the front side 121 of the chip 120 connecting input/output pads of the chip 120 to bonding lines. As shown in FIG. 1, the RDL includes a plurality of central pads (e.g., the first central pad 140 and the second central pad 160), a plurality of edge pads (e.g., the first edge pad 130 and the second edge pad 150), and a plurality of conductive lines (e.g., a power line 170, a signal line 180, a power line 230, a signal line 300, a signal line 340). The central pads are disposed on the central area 124 of the chip 120, and the edge pads are disposed on the edge area 126a or 126b of the chip 120. In some embodiments, the chip 120 has a vertical connection element (e.g., vertical via) electrically connected to the central pads, while the edge pads are spaced apart from the vertical connection element of the chip 120. The conductive lines interconnect the central pads and the edge pads, such that the edge pads can be electrically connected to the vertical connection element through the corresponding conductive lines and central pads to form a fan-out configuration. The connected central pad and edge pad (e.g., the central pad 140 and the edge pad 130) are arranged substantially in a first direction D1.

The central pads are arranged in a second direction D2 different from the first direction D1. For example, the second direction D2 is substantially perpendicular to the first direction D1. There are two columns of central pads in FIG. 1. However, the number of columns of central pads can be one or more than three. Also, the edge pads are arranged in the second direction D2.

The conductive lines include signal lines (e.g., the signal line 180, the signal line 300, the signal line 340) and power lines (the power line 170, the power line 230). Each of the conductive lines extends substantially in the first direction D1. The power lines may be coupled to a Vdd source or a ground source. The signal lines may be coupled to a wave source (e.g., address, data, and/or comment signals).

As shown in FIGS. 1 and 2A, the first edge pad 130 is disposed on the edge area 126a of the chip 120. The first central pad 140 is disposed on the central area 124 of the chip 120 and electrically connected to the first edge pad 130. In some embodiments, as shown in FIG. 1, the first edge pad 130 and the first central pad 140 are aligned in the first direction D1.

As shown in FIGS. 1 and 2B, the second edge pad 150 may be disposed on the edge area 126a of the chip 120. The second central pad 160 is disposed on the central area 124 of the chip 120 and electrically connected to the second edge pad 150. In some embodiments, a distance d1 between the first edge pad 130 and the sidewall 122a of the chip 120 is substantially smaller than a distance d2 between the second edge pad 150 and the sidewall 122a of the chip 120. In other words, a reference line RF shown in FIG. 2A and FIG. 2B is adjacent to the sidewall 122a of the chip 120. The reference line RF is through the first edge pad 130 in FIG. 2A, while not through the second edge pad 150 in FIG. 2B. The second edge pad 150 is spaced apart from reference line RF by a distance. Since the distance d1 is substantially smaller than the distance d2, the capacitance (e,g, capacitance between a signal line and conductive lines of the chip 120) can be reduced. As a result, the output signal of the semiconductor structure can be improved.

As shown in FIG. 1, the second edge pad 150 and the second central pad 160 may be aligned substantially in the first direction D1. In some embodiments, the first central pad 140 and the second central pad 160 are aligned in the second direction D2 substantially perpendicular to the first direction D1.

In some embodiments, the first edge pad 130 and the first central pad 140 are connected through the power line 170, and the second edge pad 150 and the second central pad 160 are connected through the signal line 180. In other words, the power line 170 interconnects the first edge pad 130 and the first central pad 140, and the signal line 180 interconnects the second edge pad 150 and the second central pad 160.

In some embodiments, a length of the power line 170 is substantially greater than a length of the signal line 180. The length of the power line 170 may be in a range of about 3500 micrometers to about 4500 micrometers, and the length of the signal line 180 may be in a range of about 1500 micrometers to about 2500 micrometers. For example, the length of the power line 170 is about 4000 micrometers, and the length of the signal line 180 is about 2000 micrometers. In some embodiments, the length of the signal line 180 is substantially in a range of one third to two thirds of the length of the power line 170. In some embodiments, the length of the signal line 180 is substantially a half of the length of the power line 170. With such configuration, the capacitance can be reduced, thereby improving the output signal.

In some embodiments, as shown in FIG. 1, a width w1 of the power line 170 is substantially greater than a width w2 of the signal line 180. In some embodiments, the first edge pad 130 electrically connected to the power line 170 is substantially closer to the sidewall 122a of the chip 120 than the second edge pad 150 electrically connected to the signal line 180.

In some embodiments, the semiconductor structure 100 further includes a plurality of bonding wires (e.g., the first bonding wire 190 and the second bonding wire 200) connected to corresponding edge pads (e.g., the first edge pad 130 and the second edge pad 150). The first bonding wire 190 is electrically connected between the substrate 110 and the first edge pad 130. The second bonding wire 200 is electrically connected between the substrate 110 and the second edge pad 150. In other words, the first bonding wire 190 extends from the conductive trace 112 of the substrate 110 to the first edge pad 130, while the second bonding wire 200 extends from the conductive trace 112 of the substrate 110 to the second edge pad 150. In some embodiments, one end of the first bonding wire 190 is at a position of the reference line RL (see FIG. 2A), while the second bonding wire 200 extends through the reference line RL (see FIG. 2B).

In some embodiments, a vertical projection length PL1 of the first bonding wire 190 on the chip 120 is substantially smaller than a vertical projection length PL2 of the second bonding wire 200 of the chip 120, in which the vertical projection length PL1 is substantially equal to a distance between the sidewall 122a of the chip 120 and the reference line RL.

In some embodiments, as shown in FIG. 2A, the first bonding wire 190 is in contact with the first edge pad 130, and spaced apart from the first central pad 140. In some embodiments, as shown in FIG. 2B, the second bonding wire 200 is in contact with the second edge pad 150, and spaced apart from the second central pad 160.

Figure 5:
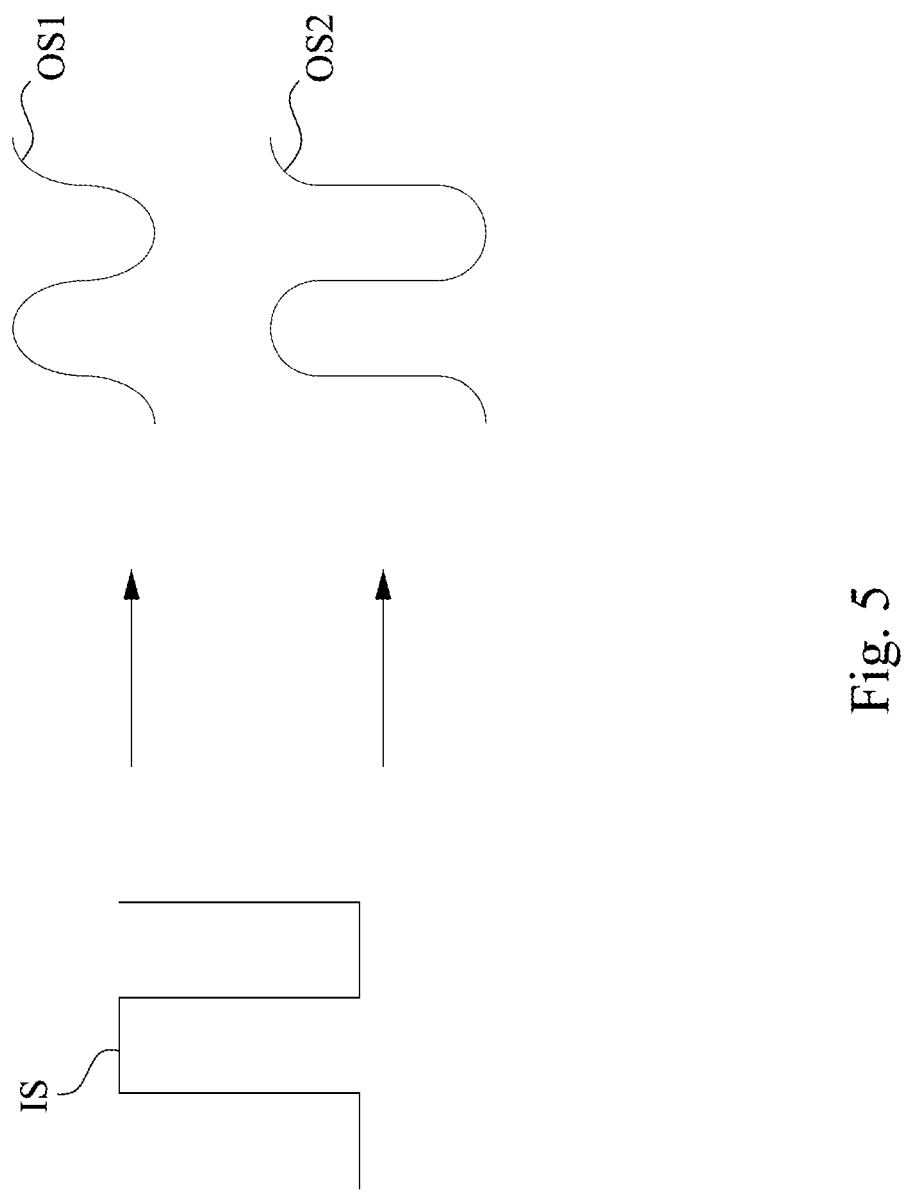
FIG. 5 is a schematic view illustrating an input signal and an output signal.

In some embodiments, a ratio of the length of the second bonding wire 200 and the length of the signal line 180 is in a range of 0.5 to 2, and thus the capacitance (e,g, capacitance between the signal line 180 and conductive lines of the chip 120) can be reduced. As a result, the output signal of the semiconductor structure 100 can be improved. Furthermore, the package of the semiconductor structure 100 can be simplified and thus the manufacturing cost can be reduced. If the ratio of the length of the second bonding wire 200 and the length of the signal line 180 is less than about 0.5, the capacitance between the signal line 180 and the conductive lines (e.g., conductive pins) in the chip 120 is high, thereby causing poor electrical interconnection. For example, when the capacitance is higher, the output signal would decay from an input terminal to an output terminal. As shown in FIG. 5, when the ratio of the length of the second bonding wire 200 and the length of the signal line 180 is less than about 0.5, an input signal IS would decay and generate an output signal OS1. In contrast, when the ratio of the length of the second bonding wire 200 and the length of the signal line 180 is in the range of about 0.5 to 2, the input signal IS would not decay (e.g., the signal decay can be ignored or avoided) and generate an improved output signal OS2.

In some embodiments, the length of the second bonding wire 200 is substantially equal to the length of the signal line 180. For example, the length of the second bonding wire 200 is about 2000 micrometers, and the length of the signal line 180 is about 2000 micrometers. In some other embodiments, the length of the second bonding wire 200 is substantially greater than the length of the signal line 180.

In some embodiments, the first bonding wire 190 and the second bonding wire 200 include copper, gold or any other suitable material. In some embodiments, the first bonding wire 190 and the second bonding wire 200 include metals, such as gold or other suitable materials.

In some embodiments, as shown in FIG. 1 and FIG. 2B, the semiconductor structure 100 further includes another central pad 210 and another edge pad 220, in which the central pad 210 and the edge pad 220 are connected through another power line 230. In other words, the power line 230 is disposed above the chip 120 and interconnects the central pad 210 and the edge pad 220. The power line 230 is substantially coplanar with the signal line 180. In some embodiments, a length of the power line 230 is substantially greater than the length of the signal line 180. The length of the power line 230 may be in a range of about 3500 micrometers to about 4500 micrometers. For example, the length of the power line 230 is about 4000 micrometers, and the length of the signal line 180 is about 2000 micrometers. In some embodiments, the length of the signal line 180 is substantially in a range of one third to two thirds of the length of the power line 230. In some embodiments, the length of the signal line 180 is substantially a half of the length of the power line 230. With such configuration, the capacitance can be reduced, thereby improving the output signal.

In some embodiments, the semiconductor structure 100 further includes another bonding wire 240 electrically connected between the substrate 110 and the edge pad 220. In other words, the bonding wire 240 extends from the conductive trace 112 of the substrate 110 to the edge pad 220. In some embodiments, a length of the bonding wire 240 is substantially smaller than the length of the length of the second bonding wire 200. A vertical projection length of the bonding wire 240 on the sidewall 122b of the chip 120 (on an opposite side relative to the sidewall 122a of the chip 120) is substantially smaller than the vertical projection length PL2 of the second bonding wire 200 on the sidewall 122a of the chip 120. In some embodiments, the bonding wire 240 is in contact with the edge pad 220, and spaced apart from the central pad 210.

Other relevant structural and manufacturing details of the central pad 210, the edge pad 220, the power line 230, and the bonding wire 240 of FIG. 2B are all substantially the same as or similar to the first edge pad 130, the first central pad 140, the power line 170, and the first bonding wire 190 of FIG. 2B, and, therefore, a description in this regard will not be repeated hereinafter.

In some embodiments, as shown in FIG. 2A and FIG. 2B, the semiconductor structure 100 includes a molding compound 250 above the substrate 110 and covers the RDL. In greater details, the molding compound 250 is disposed above the first surface 111 of the substrate 110 and covers (or encapsulates) the chip 120. In some embodiments, the molding compound 250 is disposed above the conductive trace 112 of the substrate 110, and a sidewall of the conductive trace 112 is exposed. In FIG. 2A, the molding compound 250 surrounds the chip 120, the power line 170, and the first bonding wire 190. As such, the molding compound 250 is in contact with the first edge pad 130, the first central pad 140, the power line 170, and the first bonding wire 190. In FIG. 2B, the molding compound 250 surrounds the chip 120, the signal line 180, the power line 230, the second bonding wire 200, and the bonding wire 240. As such, the molding compound 250 is in contact with the chip 120, the second edge pad 150, the edge pad 220, the second central pad 160, the central pad 210, the signal line 180, the power line 230, the second bonding wire 200, and the bonding wire 240.

In some embodiments, the molding compound 250 can be a single-layer film or a composite stack. The molding compound 250 may include various materials, such as molding compound, molding compound underfill, epoxy, resin, or the like. In some embodiments, the molding compound 250 has a high thermal conductivity, a low moisture absorption rate and/or a high flexural strength.

In some embodiments, the substrate 110 further includes a conductive trace 116 extending on the second surface 113 of the substrate 110 and a plurality of conductive vias 114 extending through the substrate 110. The conductive vias 114 may interconnects the conductive traces 112 and 116. The conductive vias 114 may be made of gold, silver, copper, nickel, tungsten, aluminum, palladium, alloys thereof, or other suitable materials.

In some embodiments, the semiconductor structure 100 further includes conductive bumps 260 on the second surface 113 of the substrate 110. The conductive bump 260 may include conductive material such as solder, copper, nickel, or gold. In some embodiments, the conductive bump 260 is a solder ball, a ball grid array (BGA) ball, controlled collapse chip connection (C4) bump, microbump, a pillar or the like. In some embodiments, the conductive bump 180 has a spherical, hemispherical or cylindrical shape. Signal of the first central pad 140 is electrically connected to one of the conductive bumps 260 through the power line 170, the first edge pad 130, the first bonding wire 190, the conductive trace 112, and the conductive via 114. Similarly, signal of the second central pad 160 is electrically connected to another of the conductive bumps 260 through the signal line 180, the second edge pad 150, the second bonding wire 200, the conductive trace 112, and the conductive via 114.

Figure 3:
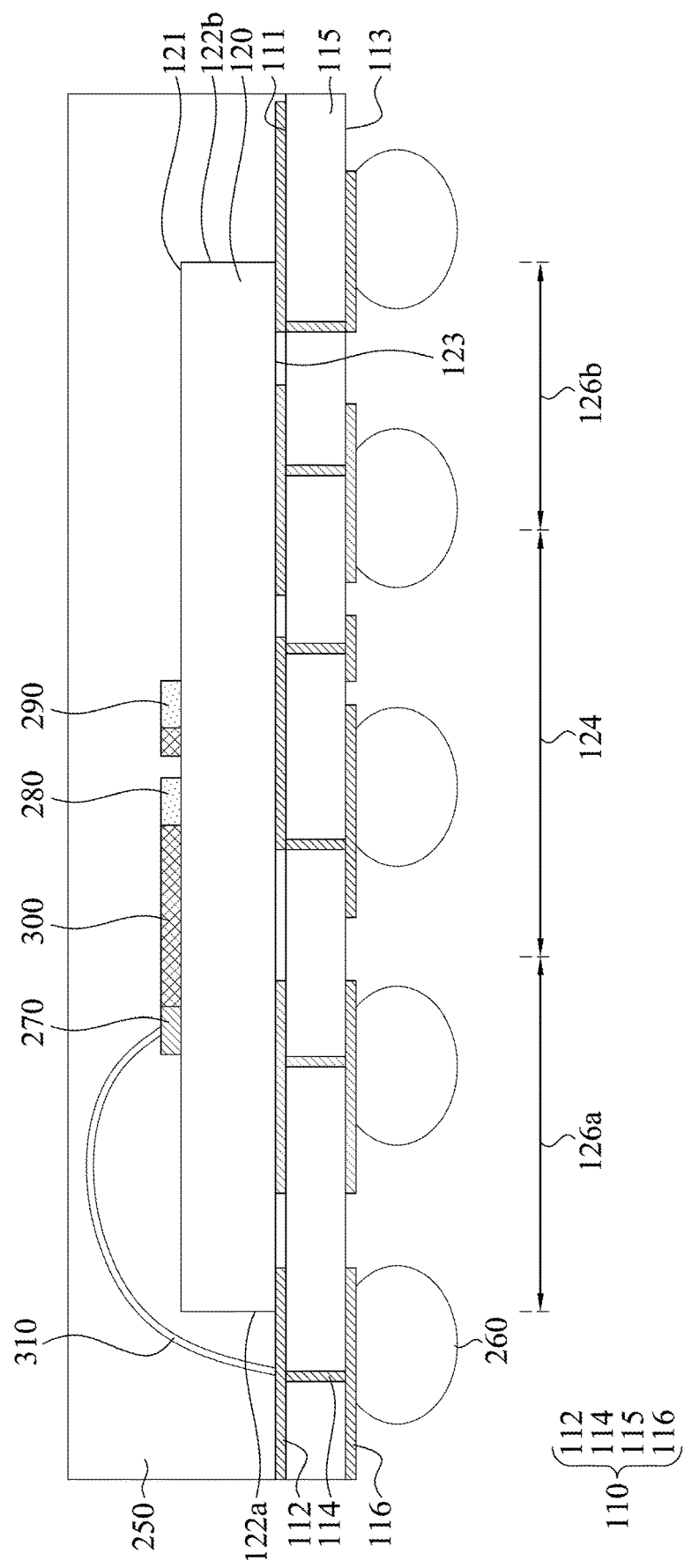
FIG. 3 is a cross-sectional view taken along line 3-3 of FIG. 1.

Referring back to FIG. 1, the layout view of the semiconductor structure 100 illustrates fan-out lines structure. FIG. 3 is a cross-sectional view taken along line 3-3 of FIG. 1, and FIG. 4 is a cross-sectional view taken along line 4-4 of FIG. 1.

Referring to FIG. 1 and FIG. 3, the semiconductor structure 100 further includes an edge pad 270, a central pad 280, a central pad 290, a signal line 300, and the bonding wire 310. The edge pad 270, the central pad 280, the central pad 290, and the signal line 300 are disposed above the chip 120. The signal line 300 interconnects the edge pad 270 and the central pad 210. The bonding wire 310 is electrically connected between the substrate 110 and the edge pad 270. In other words, the bonding wire 310 extends from the conductive trace 112 of the substrate 110 to the edge pad 270. In some embodiments, the bonding wire 310 is in contact with the edge pad 270, and spaced apart from the central pads 280 and 290. In some embodiments, the central pad 290 is electrically connected to another signal line that is adjacent to the signal line 300.

In some embodiments, a ratio of a length of the bonding wire 310 and a length of the signal line 300 is in a range of 0.5 to 2, and thus the capacitance (e,g, capacitance between the signal line 300 and conductive lines of the chip 120) can be reduced. As a result, the output signal of the semiconductor structure 100 can be improved. Furthermore, the package of the semiconductor structure 100 can be simplified and thus the manufacturing cost can be reduced. Other relevant structural and manufacturing details of the edge pad 270, the central pad 280, the central pad 290, the signal line 300, and the bonding wire 310 of FIG. 3 are all substantially the same as or similar to the second edge pad 150, the second central pad 160, the central pad 210, the signal line 180, and the second bonding wire 200 of FIG. 2B, and, therefore, a description in this regard will not be repeated hereinafter.

Figure 4:
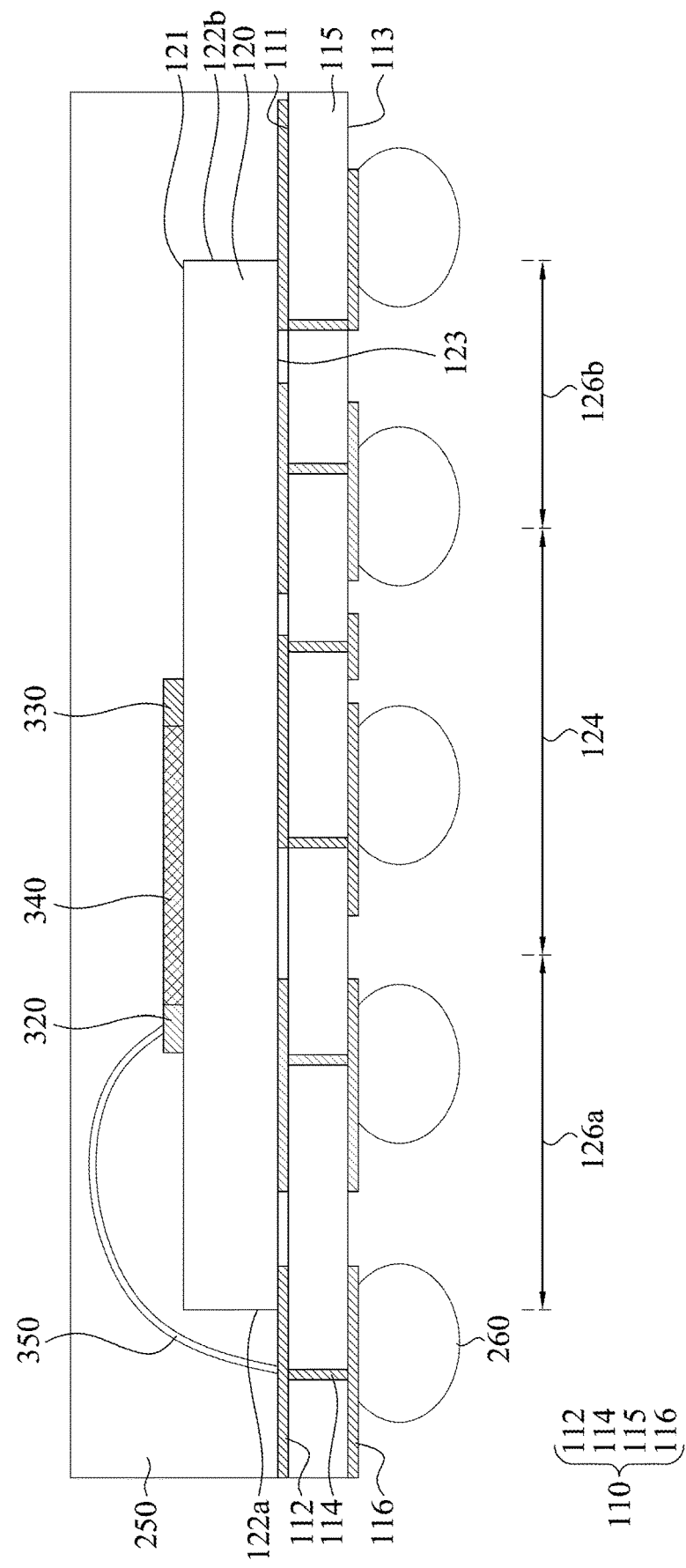
FIG. 4 is a cross-sectional view taken along line 4-4 of FIG. 1.

Referring to FIG. 1 and FIG. 4, the semiconductor structure 100 further includes an edge pad 320, a central pad 330, a signal line 340, and the bonding wire 350. The edge pad 320, the central pad 330, and the signal line 340 are disposed above the chip 120. The signal line 340 interconnects the edge pad 320 and the central pad 330. The bonding wire 350 is electrically connected between the substrate 110 and the edge pad 320. In other words, the bonding wire 350 extends from the conductive trace 112 of the substrate 110 to the edge pad 320. In some embodiments, the bonding wire 350 is in contact with the edge pad 320, and spaced apart from the central pad 330.

In some embodiments, a ratio of a length of the bonding wire 350 and a length of the signal line 340 is in a range of 0.5 to 2, and thus the capacitance (e,g, capacitance between the signal line 300 and conductive lines of the chip 120) can be reduced. As a result, the output signal of the semiconductor structure 100 can be improved. Furthermore, the package of the semiconductor structure 100 can be simplified and thus the manufacturing cost can be reduced. Other relevant structural and manufacturing details of the edge pad 320, the central pad 330, the signal line 340, and the bonding wire 350 of FIG. 4 are all substantially the same as or similar to the second edge pad 150, the second central pad 160, the signal line 180, and the second bonding wire 200 of FIG. 2B, and, therefore, a description in this regard will not be repeated hereinafter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
    a substrate having a first surface and a conductive trace extending above the substrate;
    a chip above the first surface of the substrate, wherein the chip has a sidewall, a central area, and an edge area between the central area and the sidewall;
    a first edge pad on the edge area of the chip;
    a first central pad on the central area of the chip and electrically connected to the first edge pad;
    a second edge pad on the edge area of the chip, wherein a distance between the first edge pad and the sidewall of the chip is substantially smaller than a distance between the second edge pad and the sidewall of the chip; and
    a second central pad on the central area of the chip and electrically connected to the second edge pad.

2. The semiconductor structure of claim 1, wherein the first edge pad and the first central pad are aligned in a first direction, and wherein the second edge pad and the second central pad are aligned substantially in the first direction.

3. The semiconductor structure of claim 2, wherein the first central pad and the second central pad are aligned in a second direction substantially perpendicular to the first direction.

4. The semiconductor structure of claim 1, wherein the first edge pad and the first central pad are connected through a power line, and wherein the second edge pad and the second central pad are connected through a signal line.

5. The semiconductor structure of claim 4, wherein a length of the power line is substantially greater than a length of the signal line.

6. The semiconductor structure of claim 4, wherein a width of the power line is substantially greater than a width of the signal line.

7. The semiconductor structure of claim 4, further comprising:
    a first bonding wire electrically connected between the substrate and the first edge pad; and
    a second bonding wire electrically connected between the substrate and the second edge pad.

8. The semiconductor structure of claim 7, wherein a vertical projection length of the first bonding wire on the chip is substantially smaller than a vertical projection length of the second bonding wire on the chip.

9. The semiconductor structure of claim 7, wherein the first bonding wire is spaced apart from the first central pad, and the second bonding wire is spaced apart from the second central pad.

10. The semiconductor structure of claim 7, wherein a ratio of a length of the second bonding wire and a length of the signal line is in a range of 0.5 to 2.

11. The semiconductor structure of claim 1, further comprising:
    a molding compound above the first surface of the substrate and covering the chip.

12. The semiconductor structure of claim 1, further comprising:
    a conductive bump on a second surface of the substrate opposite to the first surface.

13. A semiconductor structure, comprising:
    a substrate having a first surface and a conductive trace extending above the substrate;
    a chip above the first surface of the substrate;
    an edge pad on the chip;
    a central pad on a central area of the chip;
    a signal line above the chip, the signal line interconnects the edge pad and the central pad; and
    a bonding wire electrically connected between the substrate and the edge pad, wherein a ratio of a length of the bonding wire and a length of the signal line is in a range of 0.5 to 2.

14. The semiconductor structure of claim 13, wherein the length of the bonding wire is substantially equal to the length of the signal line.

15. The semiconductor structure of claim 13, wherein the bonding wire extends from the conductive trace to the edge pad.

16. The semiconductor structure of claim 13, further comprising:
    a power line above the chip, the power line substantially coplanar with the signal line.

17. The semiconductor structure of claim 16, wherein a length of the power line is substantially greater than the length of the signal line.

18. The semiconductor structure of claim 13, further comprising:
    a molding compound above the first surface of the substrate and covering the chip.

19. The semiconductor structure of claim 18, wherein the molding compound is in contact with the edge pad, the central pad, and the signal line.

20. The semiconductor structure of claim 13, further comprising:
    a conductive bump on a second surface of the substrate opposite to the first surface.

* * * * *